United States Patent
Takeda et al.

(10) Patent No.: US 11,618,942 B2
(45) Date of Patent: Apr. 4, 2023

(54) SPUTTERING-TARGET MATERIAL, SPUTTERING TARGET, SPUTTERING-TARGET ALUMINUM PLATE, AND METHOD OF MANUFACTURING THE SAME

(71) Applicants: UACJ Corporation, Tokyo (JP); SUMITOMO CHEMICAL COMPANY, LIMITED, Tokyo (JP)

(72) Inventors: Hiroki Takeda, Aichi (JP); Masahiro Fujita, Ehime (JP)

(73) Assignees: UACJ CORPORATION, Tokyo (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 530 days.

(21) Appl. No.: 16/619,721

(22) PCT Filed: Jun. 21, 2018

(86) PCT No.: PCT/JP2018/023573
§ 371 (c)(1),
(2) Date: Dec. 5, 2019

(87) PCT Pub. No.: WO2018/235889
PCT Pub. Date: Dec. 27, 2018

(65) Prior Publication Data
US 2020/0199739 A1    Jun. 25, 2020

(30) Foreign Application Priority Data
Jun. 22, 2017    (JP) .............. JP2017-122210

(51) Int. Cl.
*H01J 37/34*    (2006.01)
*C23C 14/34*    (2006.01)
*C22F 1/04*    (2006.01)

(52) U.S. Cl.
CPC ............ *C23C 14/3414* (2013.01); *C22F 1/04* (2013.01); *H01J 37/3426* (2013.01)

(58) Field of Classification Search
None
See application file for complete search history.

(56) References Cited

U.S. PATENT DOCUMENTS

| | | |
|---|---|---|
| 5,456,815 A | 10/1995 | Fukuyo et al. |
| 2003/0052000 A1 | 3/2003 | Segal et al. |
| 2003/0098102 A1 | 5/2003 | Perry et al. |
| 2003/0098103 A1* | 5/2003 | Perry ................ C22F 1/04 148/415 |

(Continued)

FOREIGN PATENT DOCUMENTS

| | | |
|---|---|---|
| CN | 101613848 A | 12/2009 |
| CN | 102002653 A | 4/2011 |

(Continued)

OTHER PUBLICATIONS

Office Action from the Chinese Patent Office dated Mar. 15, 2021 in related CN application No. 201880035775.9, and translation thereof.

(Continued)

*Primary Examiner* — Jason Berman
(74) *Attorney, Agent, or Firm* — J-Tek Law PLLC; Jeffrey D. Tekanic; Scott T. Wakeman

(57) ABSTRACT

A sputtering-target material (2) is composed of aluminum having a purity of 99.999 mass % or higher and unavoidable impurities. When an average crystal-grain diameter at the plate surface (21) is given as $D_s$ [μm], an average crystal-grain diameter at a depth of ¼$^{th}$ of the plate thickness (22) is given as $D_q$ [μm], and an average crystal-grain diameter at a depth of ½ of the plate thickness (23) is given as $D_c$ [μm], the formulas below are satisfied, and the average crystal-grain diameter changes continuously in a plate-thickness direction.

(Continued)

$D_s \leq 230$ $D_q \leq 280$ $D_c \leq 300$ $1.2 \leq D_q/D_s$ $1.3 \leq D_c/D_s$

20 Claims, 2 Drawing Sheets

(56) References Cited

U.S. PATENT DOCUMENTS

| | | | |
|---|---|---|---|
| 2005/0155856 A1 | 7/2005 | Oda | |
| 2005/0230011 A1 | 10/2005 | Perry et al. | |
| 2007/0062806 A1 | 3/2007 | Oda | |
| 2007/0062807 A1 | 3/2007 | Oda | |
| 2012/0325655 A1 | 12/2012 | Iwasaki et al. | |
| 2013/0306468 A1 | 11/2013 | Matsumoto et al. | |

FOREIGN PATENT DOCUMENTS

| | | | |
|---|---|---|---|
| CN | 103834924 A | 6/2014 | |
| CN | 106282945 A | 1/2017 | |
| JP | H032369 A | 1/1991 | |
| JP | H0681141 A | 3/1994 | |
| JP | H06299342 A | 10/1994 | |
| JP | 2004107758 A | 4/2004 | |
| JP | 2005509741 A | 4/2005 | |
| JP | 2010132942 A | 6/2010 | |
| JP | 5328017 B2 | 10/2013 | |
| JP | 2014047383 A | 3/2014 | |
| JP | 2017150015 A | 8/2017 | |
| TW | I263688 B | 10/2006 | |
| TW | I444492 B | 7/2014 | |
| WO | 2011105583 A1 | 9/2011 | |
| WO | WO-2011105583 A1 * | 9/2011 | ............ C22C 21/00 |
| WO | 2012105136 A1 | 8/2012 | |

OTHER PUBLICATIONS

Office Action from the Japanese Patent Office dated Jun. 14, 2022 in counterpart JP application No. 2019-525679, and machine translation thereof.

English translation of the International Search Report dated Aug. 7, 2018 for parent application No. PCT/JP2018/023573.

English translation of the Written Opinion of the International Searching Authority for parent application No. PCT/JP2018/023573.

Office Action from the Taiwanese Patent Office dated Jun. 9, 2021 in related TW application No. 107121468, and translation thereof.

* cited by examiner

SPUTTERING-TARGET MATERIAL, SPUTTERING TARGET, SPUTTERING-TARGET ALUMINUM PLATE, AND METHOD OF MANUFACTURING THE SAME

CROSS-REFERENCE

This application is the US national stage of International Patent Application No. PCT/JP2018/023573 filed on Jun. 21, 2018, which claims priority to Japanese Patent Application No. 2017-122210 filed on Jun. 22, 2017.

TECHNICAL FIELD

The present invention relates to a sputtering-target, high-purity aluminum plate and a method of manufacturing the same, which are used when forming a thin film on a substrate using a sputtering method, and further relates to a sputtering-target material and a sputtering target, for which that sputtering-target, high-purity aluminum plate is used.

BACKGROUND ART

Pure metal films, such as pure Cr films, pure Ta films, and pure Ti films, which are principally of refractory metals, and alloy films thereof have been used in the past (e.g., Patent Document 1) in electric-wiring films, electrodes, and the like, which are used in: liquid crystal displays, in which thin-film devices are manufactured on a glass substrate; plasma displays; thin-film sensors; and the like.

In recent years, along with the increase in size and definition of displays, there has been a demand for lower resistance and low stress to prevent signal delay, and for the stabilization of those characteristics in electric-wiring films and electrode films. Consequently, high-purity aluminum films, whose resistance is even lower than that of the metal films described above, have come into use.

Metal thin films formed on the above-mentioned substrate are formed by a technique that deposits atoms on the substrate and thereby forms a thin film, a so-called sputtering method, in which a plasma discharge is formed between the substrate and a target material, which constitutes a raw material when forming the thin film, and ionized argon ejects atoms, which are composed of the target material, using energy from the collision with the target material.

In sputtering apparatuses for implementing sputtering methods, a sputtering target, which is composed of the target material, is disposed at a prescribed location inside a chamber that forms a plasma-discharge space. For example, examples of previously existing target materials are described in Patent Documents 1-6.

It is known that, if the crystal-grain diameter of the sputtering-target material is large, then variations of the thickness of the film formed by the sputtering will become large. In addition, if the crystal-grain diameter is large, then unevenness due to differences in the crystal planes of the surface of the target material tends to occur in the sputtering stage. Furthermore, if unevenness arises on the surface of the target material, then electric charge will concentrate at that unevenness, and consequently splashing due to abnormal discharge will tend to occur.

Splashing refers to a sputtering defect in which portions of the sputtering target separate, become particles having a size of several to several hundred microns, and adhere to the substrate. The occurrence of splashing is not preferable because it leads to a degradation in film-thickness distribution and a reduction in productivity. Splashing tends to occur also in situations in which defects, such as cracks, voids, and the like in the structure of the target, exist, that is, also when spaces exist.

Furthermore, from the viewpoint of improving production efficiency, there is a demand to lengthen the life of the target material, and there has been a trend in which sputtering is performed for a long time. When sputtering is performed for a long time, unevenness due to differences in the crystal planes, as described above, tends to occur, and local depletion of the target material due to this unevenness tends to progress; consequently, there is a demand for a target material in which the effect of inhibiting unevenness is greater than in the past.

PRIOR ART LITERATURE

Patent Documents

Patent Document 1
  Japanese Laid-open Patent Publication H6-81141
Patent Document 2
  Japanese Laid-open Patent Publication H6-299342
Patent Document 3
  Japanese Laid-open Patent Publication 2014-47383
Patent Document 4
  Japanese Patent No. 5328017
Patent Document 5
  Japanese Laid-open Patent Publication H3-2369
Patent Document 6
  Japanese Laid-open Patent Publication 2004-107758

SUMMARY OF THE INVENTION

The present invention was conceived considering such problems described above, and an object of the present invention is to provide a sputtering-target aluminum plate and a method of manufacturing the same, in which, by making the crystal-grain diameters and the crystal planes differently from those in the past, local depletion during sputtering can be inhibited and, while preventing a decrease in productivity by also inhibiting splashing, the thickness of metal films, formed even by sputtering for a longer time, can be made uniform, and resistance can be lowered; and further to provide a sputtering-target material and a sputtering target, for which that sputtering-target, high-purity aluminum plate is used.

As a result of diligent investigation, the present inventors discovered that the past problems described above can be solved by controlling the structure of the sputtering-target material such that the crystal-grain diameters become bigger approaching the center part in the plate-thickness direction.

For example, in Patent Documents 1-4, from the viewpoint of reducing film-thickness variation, the crystal-grain diameter and the crystal planes of the sputtering-target material are controlled. However, as discovered by the present inventors, structure control, in which the crystal-grain diameters and the crystal planes of the sputtering surface change continuously from the plate surface toward the center part in the plate-thickness direction, is not performed, and thus the effects thereof are insufficient.

In Patent Document 5, structure control, in which the structure changes in the plate-thickness direction, is implemented; however, this structural configuration differs from the structural configuration prescribed by the present invention. In addition, it requires clad rolling, which joins differing materials together, and, compared with the present invention, which is achieved using a standalone material, there are problems from the viewpoints of production efficiency, cost, etc. of the target raw material.

In addition, in Patent Document 6, too, structure control, in which the structure changes in the plate-thickness direction, is implemented; however, tantalum, whose crystal structure differs from that of the present invention, is predominant, and the manufacturing method is also based on forging in a rotary-shaft direction.

Here, texture control in particular presents technically high hurdles. Depending on the texture, the crystal structure differs of course, the method of plastic working, such as rolling, compression, extrusion, and the like, differs, and, if the alloy series differs even for the same aluminum alloy, then, because the texture formed will also change, the structure-control method itself also differs. In the present invention, an ideal structure was discovered strictly in high-purity aluminum having a purity of 99.999 mass % or higher; in addition, structure control was achieved by rolling the suitable standalone material in mass production.

That is, one aspect of the present invention is the sputtering-target material according to <<1>> to <<3>> below.

<<1>>

A sputtering-target material composed of: aluminum having a purity of 99.999 mass % or higher and unavoidable impurities; wherein, when an average crystal-grain diameter at the plate surface is given as $D_s$ [μm], an average crystal-grain diameter at a depth of $1/4^{th}$ of the plate thickness is given as $D_q$ [μm], and an average crystal-grain diameter at a depth of ½ of the plate thickness is given as $D_c$ [μm], formula (1) to formula (5) below are satisfied, and the average crystal-grain diameter changes continuously in a plate-thickness direction.

$$D_s \leq 230 \tag{1}$$

$$D_q \leq 280 \tag{2}$$

$$D_c \leq 300 \tag{3}$$

$$1.2 \leq D_q/D_s \tag{4}$$

$$1.3 \leq D_c/D_s \tag{5}$$

<<2>>

The sputtering-target material according to <<1>>, wherein:
at least one combination from among the combination of formula (6) and formula (7) below and the combination of formula (8) and formula (9) below is further satisfied.

$$1.5 \leq A_{001q}/A_{001s} \tag{6}$$

$$2.0 \leq A_{001c}/A_{001s} \tag{7}$$

$$0 < A_{123q}/A_{123s} \leq 0.85 \tag{8}$$

$$0 < A_{123c}/A_{123s} \leq 0.65 \tag{9}$$

Therein:
$A_{001s}$ is an area ratio of the {001} plane at the plate surface;
$A_{001q}$ is an area ratio of the {001} plane at a depth of $1/4^{th}$ of the plate thickness;
$A_{001c}$ is an area ratio of the {001} plane at a depth of ½ of the plate thickness;
$A_{123s}$ is an area ratio of the {123} plane at the plate surface;
$A_{123q}$ is an area ratio of the {123} plane at a depth of $1/4^{th}$ of the plate thickness; and
$A_{123c}$ is an area ratio of the {123} plane at a depth of ½ of the plate thickness.

<<3>>

The sputtering-target material according to <<2>>, wherein:
at least one from among formula (10) to formula (13) below is further satisfied.

$$0 < A_{011c}/A_{011s} \leq 0.9 \tag{10}$$

$$0 < A_{111c}/A_{111s} \leq 0.7 \tag{11}$$

$$0 < A_{112c}/A_{112s} \leq 0.9 \tag{12}$$

$$0 < A_{113c}/A_{113s} \leq 0.9 \tag{13}$$

Therein:
$A_{011s}$ is an area ratio of the {011} plane at the plate surface;
$A_{011c}$ is an area ratio of the {011} plane at a depth of ½ of the plate thickness;
$A_{111s}$ is an area ratio of the {111} plane at the plate surface;
$A_{111c}$ is an area ratio of the {111} plane at a depth of ½ of the plate thickness;
$A_{112s}$ is an area ratio of the {112} plane at the plate surface;
$A_{112c}$ is an area ratio of the {112} plane at a depth of ½ of the plate thickness;
$A_{113s}$ is an area ratio of the {113} plane at the plate surface; and
$A_{113c}$ is an area ratio of the {113} plane at a depth of ½ of the plate thickness.

Another aspect of the present invention is the sputtering-target aluminum plate according to <<4>> to <<6>> below.

<<4>>

A sputtering-target aluminum plate composed of:
aluminum having a purity of 99.999 mass % or higher and unavoidable impurities; wherein, when an average crystal-grain diameter at the plate surface is given as $d_s$ [μm], an average crystal-grain diameter at a depth of $1/4^{th}$ of the plate thickness is given as $d_q$ [μm], and an average crystal-grain diameter at a depth of ½ of the plate thickness is given as $d_c$ [μm], formula (1') to formula (5') below are satisfied, and the average crystal-grain diameter changes continuously in a plate-thickness direction.

$$d_s \leq 230 \tag{1'}$$

$$d_q \leq 280 \tag{2'}$$

$$d_c \leq 300 \tag{3'}$$

$$1.2 \leq d_q/d_s \tag{4'}$$

$$1.3 \leq d_c/d_s \tag{5'}$$

<<5>>

The sputtering-target aluminum plate according to <<4>>, wherein:
at least one combination from among the combination of formula (6') and formula (7') and the combination of the combination of formula (8') and formula (9') below is further satisfied.

$$1.5 \leq B_{001q}/B_{001s} \tag{6'}$$

$$2.0 \leq B_{001c}/B_{001s} \tag{7'}$$

$$0 < B_{123q}/B_{123s} \leq 0.85 \tag{8'}$$

$$0 < B_{123c}/B_{123s} \leq 0.65 \tag{9'}$$

Therein:
$B_{001s}$ is an area ratio of the {001} plane at the plate surface;
$B_{001q}$ is an area ratio of the {001} plane at a depth of ¼$^{th}$ of the plate thickness;
$B_{001c}$ is an area ratio of the {001} plane at a depth of ½ of the plate thickness;
$B_{123s}$ is an area ratio of the {123} plane at the plate surface;
$B_{123q}$ is an area ratio of the {123} plane at a depth of ¼$^{th}$ of the plate thickness; and
$B_{123c}$ is an area ratio of the {123} plane at a depth of ½ of the plate thickness.

<<6>>

The sputtering-target aluminum plate according to <<5>>, wherein:
at least one from among formula (10') to formula (13') below is further satisfied.

$$0 < B_{011c}/B_{011s} \leq 0.9 \quad (10')$$

$$0 < B_{111c}/B_{111s} \leq 0.7 \quad (11')$$

$$0 < B_{112c}/B_{112s} \leq 0.9 \quad (12')$$

$$0 < B_{113c}/B_{113s} \leq 0.9 \quad (13')$$

Therein:
$B_{011s}$ is an area ratio of the {011} plane at the plate surface;
$B_{011c}$ is an area ratio of the {011} plane at a depth of ½ of the plate thickness;
$B_{111s}$ is an area ratio of the {111} plane at the plate surface;
$B_{111c}$ is an area ratio of the {111} plane at a depth of ½ of the plate thickness;
$B_{112s}$ is an area ratio of the {112} plane at the plate surface;
$B_{112c}$ is an area ratio of the {112} plane at a depth of ½ of the plate thickness;
$B_{113s}$ is an area ratio of the {113} plane at the plate surface; and
$B_{113c}$ is an area ratio of the {113} plane at a depth of ½ of the plate thickness.

Yet another aspect of the present invention is a method of manufacturing the sputtering-target aluminum plate according to <<7>> to <<8>> below.

<<7>>

A method of manufacturing a sputtering-target aluminum plate according to <<4>> to <<6>>, in which an ingot composed of aluminum having a purity of 99.999 mass % or higher and unavoidable impurities is rolled one time or a plurality of times, wherein:
a final pass of the rolling is performed under conditions that satisfy formula (14) and formula (15) below, wherein R [%] is the rolling reduction in the final pass of rolling and T [° C.] is the rolling-end temperature.

$$150 \leq T \leq 300 \quad (14)$$

$$R \leq 8.8 \times 10^{-4} \times (T+273)^2 - 0.9 \times (T+273) + 281 \quad (15)$$

<<8>>

The method of manufacturing the sputtering-target aluminum plate according to <<7>>, wherein:
after the final pass of rolling has been performed, the aluminum plate is further heated at 200-350° C. and thereby annealed.

According to the present invention, because the occurrence of splashing during sputtering can be inhibited, and, at the same time, local depletion during sputtering can be inhibited, production losses can be reduced and metal thin films having a uniform film thickness can be formed even when sputtering for a longer time than in the past. In addition, by strictly controlling the rolling conditions, a sputtering-target aluminum plate material having the above-mentioned excellent characteristics can be obtained efficiently and stably.

DETAILED DESCRIPTION

Figure 1A:
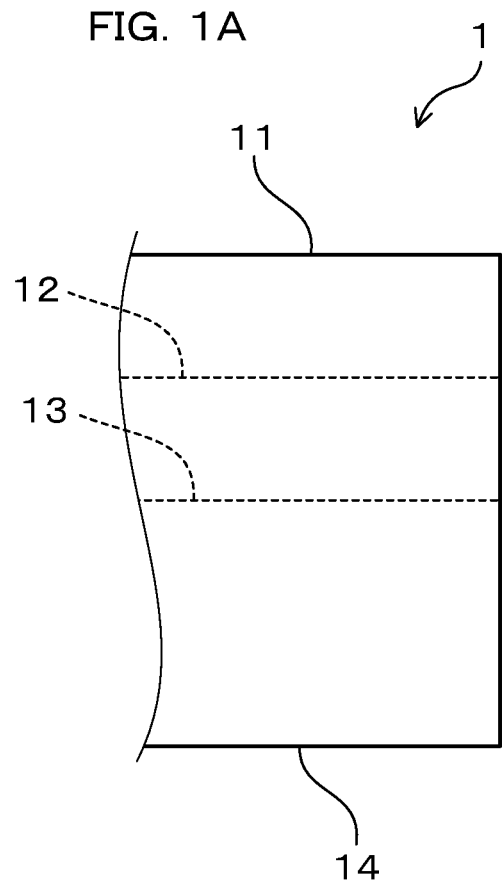
FIG. 1 is a cross-sectional view according to a working example, in which (a) shows measurement locations of the average crystal-grain diameter and the crystal-plane area ratio of an aluminum plate, and (b) shows measurement locations of the average crystal-grain diameter and the crystal-plane area ratio of a sputtering-target material.

Embodiments of the present invention are explained in detail below.

As a result of various experiments and extended research performed by the inventors to solve the problems as described above, local depletion during sputtering can be inhibited by manufacturing a sputtering-target material using a sputtering-target aluminum material that has a structure wherein the crystal-grain diameters and the crystal planes of a sputtering surface in high-purity aluminum having a purity of 99.999 mass % or higher change continuously from a plate surface toward a center part in a plate-thickness direction. Furthermore, by also inhibiting splashing, it was discovered that, while preventing production losses, the thickness of the metal film formed could be made uniform even when sputtering for a long time, and resistance could be lowered; and thereby the present invention was conceived.

In the present specification, "plate surface" may be any surface as long as it is a surface in a flat plane. With the sputtering-target material of the present invention, a plate surface that satisfies formula (1) to formula (5), which are described below, is normally used as the sputtering surface. In situations in which the sputtering-target material has, for example, two plate surfaces that satisfy formula (1) to formula (5) described below, either of those plate surfaces can be used as the sputtering surface.

The sputtering-target material according to the present invention can be suitably used as the target material in well-known sputtering methods. In addition, the sputtering-target material according to the present invention exhibits the functions and effects described above even in situations in which it is used in magnetron sputtering, in which sputtering efficiency is increased.

The sputtering-target aluminum plate and the sputtering-target material according to the present invention are composed of high-purity aluminum having a purity of 99.999 mass % or higher, as described above. If the purity of the aluminum plate is less than 99.999 mass %, then the resistance value of the formed metal film will increase, and consequently it will become difficult to obtain the targeted quality.

It is noted that, if the hydrogen content in the above-mentioned aluminum plate is high, then porosity will tend to occur. Furthermore, it is known that the porous portion will become uneven in the sputtering stage, and thereby splashing will tend to occur. From the viewpoint of avoiding such a problem, the hydrogen content per 100 g of aluminum in the above-mentioned aluminum plate is preferably 0.3 cm³ or less.

Next, the reasons for the prescribed crystal-grain diameters of the above-mentioned aluminum plate will be explained.

In one aspect of the present invention, the crystal-grain diameters of the sputtering surface of the sputtering-target material change continuously from the plate surface on the side of the sputtering-target material being used as the target material toward the center part in the plate-thickness direction, and it is prescribed that the average crystal-grain diameter at the plate surface $D_s$ [μm], the average crystal-grain diameter at a depth of $\frac{1}{4}^{th}$ of the plate thickness $D_q$ [μm], and the average crystal-grain diameter at a depth of $\frac{1}{2}$ of the plate thickness $D_c$ [μm] satisfy formula (1) to formula (5) below.

$$D_s \leq 230 \quad (1)$$

$$D_q \leq 280 \quad (2)$$

$$D_c \leq 300 \quad (3)$$

$$1.2 \leq D_q/D_s \quad (4)$$

$$1.3 \leq D_c/D_s \quad (5)$$

To obtain sputtering-target materials that satisfy formulas (1)-(5) above, the average crystal-grain diameter at the plate surface $d_s$ [μm], the average crystal-grain diameter at a depth of $\frac{1}{4}^{th}$ of the plate thickness $d_q$ [μm], and the average crystal-grain diameter at a depth of $\frac{1}{2}$ of the plate thickness $d_c$ [μm] of the aluminum plate that constitutes an original plate preferably satisfy formula (1') to formula (5') below.

$$d_s < 230 \quad (1')$$

$$d_q \leq 280 \quad (2')$$

$$d_c \leq 300 \quad (3')$$

$$1.2 \leq d_q/d_s \quad (4')$$

$$1.3 \leq d_c/d_s \quad (5')$$

In the above-mentioned aspect, as a measure against the problem in which variations in the thickness of the film formed by the sputtering become large when the crystal-grain diameter is large and the problem in which splashing tends to occur when the crystal-grain diameter is large, the sizes of the average crystal-grain diameters of the sputtering-target material are limited by formula (1) to formula (3) above. In addition, to obtain sputtering-target materials that satisfy formula (1) to formula (3) above, the sizes of the average crystal-grain diameters of the aluminum plate that constitutes the original plate are limited by formula (1') to formula (3') above.

As described above, because increased fineness of the crystal-grain diameter is effective in reducing film-thickness variations and inhibiting splashing, the average crystal-grain diameters are provided with upper limits, as given in formula (1) to formula (3) above and formula (1') to formula (3') above. On the other hand, from the viewpoint of reducing film-thickness variations and inhibiting splashing, lower-limit values for the crystal-grain diameters are not particularly needed, but there is a risk that excessively increased fineness in the crystal grains will lead to a decrease in productivity. Consequently, giving consideration to maintaining both characteristics and productivity, normally, the average crystal-grain diameter $D_s$ in formula (1) above and the average crystal-grain diameter $d_s$ in formula (1') above are 30 μm or more, the average crystal-grain diameter $D_q$ in formula (2) above and the average crystal-grain diameter $d_q$ in formula (2') above are 80 μm or more, and the average crystal-grain diameter $D_c$ in formula (3) above and the average crystal-grain diameter $d_c$ in formula (3') above are 100 μm or more.

Generally, in the initial stage of sputtering, an unstable plasma state continues during the interval from the instant that discharge is started until the target surface adapts and the discharge stabilizes. Fluctuations of the discharge during this interval tend to influence plasma stability in a sensitive manner; even though discharge fluctuations do not cause problems in the mid-stage to late-stage of sputtering, they are a factor that hinders stabilization of the plasma during the initial stage of sputtering.

As described above, during the unstable plasma state of the initial stage of sputtering, abnormal discharges tend to occur and, in addition, the duration of the abnormal discharges becomes long and it takes a long time until normal sputtering is achieved. Conversely, even if abnormal discharges occur during the stable plasma state in the mid-stage to late-stage of sputtering, it is often the case that the abnormal discharges cease relatively quickly in just a single discharge.

In other words, because the sputtering-target material is consumed, in order, from the plate surface toward the center part in the plate-thickness direction: the stage in which consumption is rapid, that is, the situation in which abnormal discharges occur in the region near the plate surface of the sputtering-target material and splashing occurs, adds to film-thickness variation; it takes a long time until the plasma state normalizes and normal sputtering is attained; and production loss becomes greater. Consequently, inhibiting the occurrence of unevenness in the rapid-consumption stage is particularly critical for inhibiting splashing, and adverse effects are limited even if unevenness starts to occur in the late stage of consumption.

Consequently, in formula (1) to formula (3) above, the crystal-grain diameters are more strictly limited in the regions near the plate surface. By virtue of the crystal-grain diameters satisfying formula (1) to formula (3) above, the occurrence of splashing can be inhibited and uniform metal-thin films can be formed while production losses are curtailed.

In addition, in the above-mentioned aspect, as a measure against the problem in which the target material is depleted locally during sputtering, the increasing size of the average crystal-grain diameters of the sputtering-target material from the plate surface toward the center part in the plate-thickness direction is prescribed by formula (4) to formula (5) above. In addition, to obtain sputtering-target materials that satisfy formula (4) to formula (5) above, it is prescribed in formula (4') to formula (5') above that the average crystal-grain diameters of the aluminum plate, which constitutes the original plate, increase in size from the plate surface toward the center part of the plate-thickness direction.

In situations in which the crystal-grain diameters are large, a large amount of energy will be needed to cause the target substance to be ejected, and therefore the sputtering speed will drop. This means that, at locations closer to the center part of the plate, that is, at local-depletion regions, which are formed when regions of larger crystal-grain diameter are sputtered, the sputtering speed decreases more than at other regions due to the effects of the crystal-grain diameters. For this reason, to inhibit local depletion of the sputtering-target material, lower limits are provided for the values of the average crystal-grain diameter ratios, as given by formula (4) to formula (5) above and formula (4') to formula (5') above. On the other hand, from the viewpoint of inhibiting local depletion of the sputtering-target material, there are no upper limits on the values of the average crystal-grain diameter ratios; however, in situations that take into consideration production processes that can be implemented on a mass-production scale, the limits on the values of the average crystal-grain diameter ratios in formula (4) to formula (5) above and formula (4') to formula (5') above are normally 4.0.

Consequently, local depletion is inhibited by virtue of formula (4) to formula (5) above being satisfied, and therefore a uniform metal thin film can be formed. With regard to inhibiting local depletion as well, the same as with inhibiting splashing, it is particularly critical to inhibit the occurrence of local depletion in the rapid-consumption stage, and the effects on film-thickness variation are limited even if local depletion begins to occur in the late stage of consumption.

From the viewpoint of inhibiting local depletion, the larger the difference in crystal-grain diameters from the plate surface toward the center part in the plate-thickness direction, the better. However, from the viewpoints of reducing film-thickness variation and inhibiting splashing, because the maximum crystal-grain diameter is determined, it is necessary to simultaneously satisfy formula (1) to formula (5) above in order to achieve all the characteristics concurrently.

Furthermore, to more reliably reduce film-thickness variation due to the effects of crystal-grain diameters and to obtain the effects of inhibiting splashing, local depletion, and the like, the average crystal-grain diameter at the plate surface $D_s$ [μm], the average crystal-grain diameter at a depth of $\frac{1}{4}^{th}$ of the plate thickness $D_q$ [μm], and the average crystal-grain diameter at a depth of $\frac{1}{2}$ of the plate thickness $D_c$ [μm] of the sputtering-target material preferably satisfy formula (16) to formula (20) below.

$$D_s \leq 210 \tag{16}$$

$$D_q \leq 275 \tag{17}$$

$$D_c \leq 300 \tag{18}$$

$$1.3 \leq D_q/D_s \tag{19}$$

$$1.4 \leq D_c/D_s \tag{20}$$

To obtain sputtering-target materials that satisfy formula (16) to formula (20) above, the average crystal-grain diameter at the plate surface $d_s$ [μm], the average crystal-grain diameter at a depth of $\frac{1}{4}^{th}$ of the plate thickness $d_q$ [μm], and the average crystal-grain diameter at a depth of $\frac{1}{2}$ of the plate thickness $d_c$ [μm] of the aluminum plate that constitutes the original plate preferably satisfy formula (16') to formula (20') below.

$$d_s \leq 210 \tag{16'}$$

$$d_q \leq 275 \tag{17'}$$

$$d_c \leq 300 \tag{18'}$$

$$1.3 \leq d_q/d_s \tag{19'}$$

$$1.4 \leq d_c/d_s \tag{20'}$$

In addition, when manufacturing a sputtering-target material from an aluminum plate, the plate surface is generally processed by cutting, polishing, etc. The amount of processing should be suitably set as needed; however, from the viewpoint of consuming the material efficiently, it is preferable to set the amount by which the plate thickness is reduced by the processing to approximately 3 mm at the maximum.

The average crystal-grain diameter D of the sputtering-target material and the sputtering-target aluminum plate prescribed in the aspect above is preferably calculated using formula (21) below.

Mathematical Formula 1

$$D = \frac{\left(\sum_{i=1}^{N} A_i d_i\right)}{\left(\sum_{i=1}^{N} A_i\right)} \tag{21}$$

Here, N represents the total number of crystal grains existing in the observation area, and $A_i$ and $d_i$ represent the area and the crystal-grain diameter, respectively, of a given crystal grain i.

In contrast to general calculating methods in which a quantity is weighted, the area is weighted in formula (21) above. The difference between general calculating methods and formula (21) above will be explained in greater detail, assuming the situation in which 75 fine grains and one coarse grain exist in the observation area. It is noted that for each fine grain, the crystal-grain diameter $d_i$ is 100 μm and the area $A_i$ is 0.01 mm²; and for each coarse grain, the crystal-grain diameter $d_i$ is 500 μm and the area $A_i$ is 0.25 mm².

If we assume the situation above, the average crystal-grain diameter D according to formula (21) above is as below.

$D$=(100 [μm]×0.01 [mm²]×75+500 [μm]×0.25 [mm²]×1)/(0.01 [mm²]×75+0.25 [mm²]×1)=200 μm

On the other hand, with general calculating methods, weighting is not given to the area, and therefore the average crystal-grain diameter D' is calculated as below.

$D'$=(100 [μm]×75+500 [μm]×1)/(75+1)=105 μm

Thus, according to formula (21) above, because the area is weighted, a value larger than that in general calculating methods is calculated in situations in which coarse crystal-grain diameters occur. For this reason, in the present invention, in which the maximum value of the average crystal-grain diameter is prescribed, the technique is stricter than general methods of calculating the average crystal-grain diameter.

A detailed method of measuring average crystal-grain diameters is described below in combination with a crystal-plane measuring method.

Next, the reasons for prescribing the crystal planes of the sputtering-target aluminum plate and the sputtering-target material according to the present invention will be explained.

In a separate aspect of sputtering-target materials according to the present invention, the crystal planes of the sputtering surface change from the plate surface on the side used as the target material toward the center part in the plate-thickness direction, and it is prescribed that at least one combination from among the combination of formula (6) and formula (7) below and the combination of formula (8) and formula (9) below is satisfied.

$$1.5 \leq A_{001q}/A_{0001s} \quad (6)$$

$$2.0 \leq A_{001c}/A_{001s} \quad (7)$$

$$0 < A_{123q}/A_{123s} \leq 0.85 \quad (8)$$

$$0 < A_{123c}/A_{123s} \leq 0.65 \quad (9)$$

To obtain sputtering-target materials that satisfy the combination of formula (6) and formula (7) above, the crystal planes of the aluminum plate that constitutes the original plate preferably satisfy the combination of formula (6') and formula (7') below. In addition, to obtain sputtering-target materials that satisfy the combination of formula (8) and formula (9) above, the crystal planes of the aluminum plate that constitutes the original plate preferably satisfy the combination of formula (8') and formula (9') below.

$$1.5 \leq B_{001q}/B_{001s} \quad (6')$$

$$2.0 \leq B_{001c}/B_{001s} \quad (7')$$

$$0 < B_{123q}/B_{123s} \leq 0.85 \quad (8')$$

$$0 < B_{123c}/B_{123s} \leq 0.65 \quad (9')$$

Because the crystal planes of the sputtering-target material satisfy at least one of the combination of formula (6) and formula (7) above and the combination of formula (8) and formula (9) above, local depletion of the sputtering-target material can be inhibited. As described also in Patent Documents 1, 2 and Patent Documents 4-6, which were discussed above, in a sputtering operation, it is known that the sputtering speed differs by crystal planes, and control of the crystal planes in aspects that differ from the aspects of the present invention has been performed in the past. There are various views regarding the strict relationship between sputtering speed and each individual crystal plane, and while it is necessary in the future to elucidate the reasons why local depletion can be inhibited in the aspects of the present teachings, at the present point in time, it is conjectured that local depletion is inhibited as a result of the decrease in sputtering speed due to the increase in the number of {001} planes and the decrease in the number of {123} planes, and therefore a uniform metal thin film can be formed.

For this reason, to inhibit local depletion of the sputtering-target material, lower limits are provided for the values of the crystal-plane ratios in formula (6) to formula (7) above and formula (6') to formula (7') above. On the other hand, from the viewpoint of inhibiting local depletion of the sputtering-target material, there are no upper limits on the values of the crystal-plane ratios; however, in situations that take into consideration production processes that can be implemented on a mass-production scale, the limits on the values of the crystal-plane ratios in formula (6) above and formula (6') above are normally 40, and likewise the upper limits on the values of the crystal-plane ratios in formula (7) above and formula (7') above are normally 50.

Likewise, to inhibit local depletion of the sputtering-target material, upper limits are provided for the values of the crystal-plane ratios in formula (8) to formula (9) above and formula (8') to formula (9') above. In addition, because the value of a crystal-plane ratio cannot take on a zero or negative value, lower limits are provided for the values of the ratios, as given in formula (8) to formula (9) above and formula (8') to formula (9') above.

In addition, local depletion can be more reliably inhibited by satisfying at least one combination from among the combination of formula (22) and formula (23) below and the combination of formula (24) and formula (25) below.

$$2.0 \leq A_{001q}/A_{001s} \quad (22)$$

$$2.5 \leq A_{001c}/A_{001s} \quad (23)$$

$$0 < A_{123q}/A_{123s} \leq 0.75 \quad (24)$$

$$0 < A_{113c}/A_{123s} \leq 0.50 \quad (25)$$

To obtain sputtering-target materials that satisfy the combination of formula (22) and formula (23) above, the crystal planes of the aluminum plate that constitutes the original plate preferably satisfy the combination of formula (22') and formula (23') below. In addition, to obtain sputtering-target materials that satisfy the combination of formula (24) and formula (25) above, the crystal planes of the aluminum plate that constitutes the original plate preferably satisfy the combination of formula (24') and formula (25') below.

$$2.0 \leq B_{001q}/B_{001s} \quad (22')$$

$$2.5 \leq B_{001c}/B_{001s} \quad (23')$$

$$0 < B_{123q}/B_{123s} \leq 0.75 \quad (24')$$

$$0 < B_{123c}/B_{123s} \leq 0.50 \quad (25')$$

In addition, by satisfying at least one from among formula (10) to formula (13) below in addition to controlling the crystal planes given in formula (6) to formula (9) above, local depletion can be much more inhibited, and a uniform metal thin film can be formed.

$$0 < A_{011c}/A_{011s} \leq 0.9 \quad (10)$$

$$0 < A_{111c}/A_{111s} \leq 0.7 \quad (11)$$

$$0 < A_{112c}/A_{112s} \leq 0.9 \quad (12)$$

$$0 < A_{113c}/A_{113s} \leq 0.9 \quad (13)$$

To obtain sputtering-target materials that satisfy formula (10) above, the crystal planes of the aluminum plate that constitutes the original plate preferably satisfy formula (10') below. Likewise, to obtain sputtering-target materials that satisfy formula (11), formula (12), and formula (13) above, the crystal planes of the aluminum plate that constitutes the original plate preferably satisfy formula (11'), formula (12'), and formula (13'), respectively, below.

$$0 < B_{011c}/B_{011s} \leq 0.9 \quad (10')$$

$$0 < B_{111c}/B_{111s} \leq 0.7 \quad (11')$$

$$0 < B_{112c}/B_{112s} \leq 0.9 \quad (12')$$

$$0 < B_{113c}/B_{113s} \leq 0.9 \quad (13')$$

A detailed investigation of the strict relationship between sputtering speed and each individual crystal plane is needed in the future, in the same manner as with formula (6) to formula (9) described above; however, it is conjectured that local depletion is inhibited as a result of the decrease in sputtering speed that occurs owing to the decrease in number of the {0H}, {111}, {112}, and {113} planes toward the center part in the plate-thickness direction. For this reason, to inhibit local depletion of the sputtering-target material, upper limits are provided for the values of the crystal-plane ratios in formula (10) to formula (13) above and formula (10') to formula (13') above. In addition, because the value of a crystal-plane ratio cannot take on a zero or negative value, lower limits are provided for the values of the ratios as given in formula (10) to formula (13) above and formula (10') to formula (13') above. Furthermore, to obtain a much greater effect of inhibiting local depletion, it is preferable to satisfy at least one from among formula (26) to formula (29) below.

$$0 < A_{011c}/A_{011s} \leq 0.8 \quad (26)$$

$$0 < A_{111c}/A_{111s} \leq 0.5 \quad (27)$$

$$0 < A_{112c}/A_{112s} \leq 0.8 \quad (28)$$

$$0 < A_{113c}/A_{113s} \leq 0.8 \quad (29)$$

To obtain sputtering-target materials that satisfy formula (26) above, the crystal planes of the aluminum plate that constitutes the original plate preferably satisfy formula (26') below. Likewise, to obtain sputtering-target materials that satisfy formula (27), formula (28), and formula (29) above, the crystal planes of the aluminum plate that constitutes the original plate preferably satisfy formula (27'), formula (28'), and formula (29'), respectively, below.

$$0 < B_{011c}/B_{011s} \leq 0.8 \quad (26')$$

$$0 < B_{111c}/B_{111s} \leq 0.5 \quad (27')$$

$$0 < B_{112c}/B_{112s} \leq 0.8 \quad (28')$$

$$0 < B_{113c}/B_{113s} \leq 0.8 \quad (29')$$

Here, a method of measuring average crystal-grain diameter and crystal-plane area ratio mentioned above will be explained. In connection with these measurements, a surface parallel to the sputtering surface is measured using a backscatter-electron-diffraction measuring apparatus (SEM-EBSD) attached to a scanning electron microscope.

In the measurement of the plate surface of the sputtering-target material, specifically, processing, such as the above-mentioned cutting process, is performed on the plate surface of the above-mentioned aluminum plate and, furthermore, a processed layer is removed by sequentially performing buffing and electrolytic polishing on that plate surface. It is noted that the amount by which the plate thickness is reduced by buffing and electrolytic polishing of the plate surface is 2 μm or less.

In the measurement of the plate surface of the above-mentioned aluminum plate, buffing and electrolytic polishing are sequentially performed on the plate surface.

In the measurement of the surfaces having a depth of $\frac{1}{4}^{th}$ of and a depth of ½ of the plate thickness of the sputtering-target material and the above-mentioned aluminum plate, after each material has been abraded down to a prescribed plate thickness by mechanical polishing and buffing, a processed layer is removed by electrolytic polishing.

The electrolytically polished surface of each material obtained by the above is measured in an area of 12 mm×6 mm. Because it is statistically preferable that approximately 5,000 crystal-grain diameters be included within the measurement range, measurement should be performed in a wider area if measurement time permits. It is noted that, if measurement of 12 mm×6 mm cannot be performed in one field of view, then measurements should be made of a plurality of fields of view, after which the orientation data of all fields of view should be integrated into a single data set using EBSD analysis measurement software, which is described below. The measurement step size is preferably set to approximately $\frac{1}{10}^{th}$ of the crystal-grain diameter. In the present invention, measurements were performed using 5 μm; in addition, in situations in which the angular difference between adjacent orientations was 5% or more, the boundary lines between those adjacent orientations were regarded as crystal-grain boundaries.

The average crystal-grain diameters and the area ratios of the orientation planes were derived from the obtained data using EBSD analysis software. For example, "OIM Analysis" developed by TSL Solutions Ltd. can be used as the analysis software. The average crystal-grain diameters were calculated using the method that weights area, which was discussed above; and the area ratios of the crystal planes were calculated with the permissible angle set to ±10° from the ideal orientation. Below is a summary of the method of measuring the crystal-grain diameters and the crystal planes described in the working examples.

Apparatus: A backscatter-electron-diffraction imaging apparatus made by TSL Solutions Ltd.
Measurement Software: OIM Data Collection ver. 5.31
Analysis Software: OIM Analysis ver. 5.31
Measurement Area: Area of 12 mm×6 mm
Step Size: 5 μm
Crystal-Grain Boundary: An orientation difference between adjacent measurement points of 5% or more
Permissible Range in Crystal-Plane Analysis: ±10° from the ideal orientation It is noted that, as a matter of course, even if both the crystal-grain-diameter stipulations and the crystal-plane stipulations discussed above are satisfied, it is possible to obtain the effect of reducing film-thickness variations owing to the influence of crystal-grain diameters and the effective reducing film-thickness variations by inhibiting the occurrence of abnormal discharges during sputtering and by inhibiting local depletion of the target material during sputtering. In addition, if the crystal-grain-diameter stipulations and the crystal-plane stipulations discussed above are satisfied for both the surface side on which sputtering is performed and the opposite side thereof, then there is an advantage in that the sputtering-target material can be manufactured regardless of whether it is on the front or rear of the sputtering-target aluminum plate.

Next, a method of manufacturing the sputtering-target aluminum plate according to the present invention will be explained.

In methods of manufacturing the sputtering-target aluminum plate according to the present invention, a plate having a final plate thickness is obtained by rolling, one or more times, an ingot composed of high-purity aluminum having a purity of 99.999 mass % or higher, as described above. If the purity of the above-mentioned ingot is less than 99.999 mass %, then the resistance value of the thin film formed using the obtained sputtering-target material will increase, and therefore it will become less advantageous to use aluminum as the target.

In the above-mentioned rolling, it is necessary that the rolling reduction R [%] and the rolling-end temperature T [° C.] satisfy, at least in the final pass, formula (14) to formula (15) above.

$$150 \leq T \leq 300 \quad (14)$$

$$R \leq 8.8 \times 10^{-4} \times (T+273)^2 - 0.9 \times (T+273) + 281 \quad (15)$$

By performing the final pass of the rolling under the conditions above, it is possible to introduce strain energies that differ according to location in the plate-thickness direction. Furthermore, because the rolling-end temperature, that is, the temperature of the aluminum plate when rolling ends, is sufficient as a recrystallization temperature, the crystal-grain diameters and the crystal planes can be changed in the plate-thickness direction without performing a separate annealing. As a result, sputtering-target aluminum plates that satisfy the above-described stipulations can be obtained.

To perform the structure control described above, a large rolling reduction in a single pass is necessary and essential. In addition, in situations in which the rolling-end temperature is low, a large strain energy will be needed to induce recrystallization. Consequently, in situations in which the rolling temperature is low, a larger amount of rolling reduction is necessary. On the other hand, in situations in which the rolling temperature is high, strain energy originates more easily. Consequently, a larger amount of rolling reduction is necessary to accumulate sufficient strain energy during rolling. Based on the above, if the abscissa represents the rolling-end temperature T and the ordinate represents the rolling reduction R in the final pass, then the boundaries of the suitable ranges of the rolling-end temperature T and the rolling reduction R in the final pass describe parabolas having downward convexity as prescribed in formula (15) above. On the other hand, if the rolling reduction R in the final pass becomes excessively large, then there is a risk that it will lead to surface defects, shape defects, or the like in the rolled plate that is obtained. To avoid these problems, it is preferable to set the rolling reduction R in the final pass to 80% or less.

In addition, in the situation in which the rolling-end temperature is lower than 150° C., recrystallization after rolling does not occur, and residual strain caused by the occurrence of splashing becomes large. On the other hand, if the rolling-end temperature exceeds 300° C., then the crystal-grain diameter will coarsen due to grain growth, and consequently there is a risk that the crystal-grain diameter stipulations will no longer be satisfied. In addition, in situations in which the rolling reduction in the final pass does not satisfy formula (15) above, the difference in strain energies in the plate-thickness direction will become small, and it will be difficult to control the crystal-grain diameters and the crystal planes in the plate-thickness direction as prescribed by the formulas above. For example, in situations in which the rolling-end temperature T is 200° C. or 300° C., a rolling reduction R of 52.2% or more or 54.2% or more, respectively, will become necessary.

In addition, by satisfying formula (30) below instead of formula (15) above, it is possible to more reliably inhibit abnormal discharges and local depletion.

$$R \leq 8.8 \times 10^{-4} \times (T+273)^2 - 0.9 \times (T+273) + 286 \quad (30)$$

Recrystallization and the introduction of strain energy via the final pass of the rolling are the dominant factors in controlling the structure as described above. Consequently, the rolling reduction, the temperature, and the like are not particularly prescribed in the rolling conditions of the passes except for the final pass, and suitable conditions may be set as needed. Taking into consideration manufacture on a mass-production scale, the rolling-start temperature in passes except for the final pass can be set to, for example, 150° C. or higher and 500° C. or lower. At a rolling-start temperature of lower than 150° C., deformation resistance will become large, and consequently there is a risk that it will lead to an increase in the number of rolling passes and a decrease in production efficiency. On the other hand, if the rolling-start temperature exceeds 500° C., it will only increase the fuel cost needed for heating, or a cooling process may become necessary to bring the rolling-end temperature in the final pass into the above-described range.

In addition, in the above-mentioned manufacturing method, a homogenization process, cold rolling, a heat treatment, or the like may be performed as needed, but they are not needed from the standpoint of satisfying the crystal-grain diameter stipulation and crystal plane stipulation, and, because they will increase the number of processes, they will decrease production efficiency.

Furthermore, the sputtering-target aluminum plate according to the present invention can also be manufactured by rolling an ingot in only one pass.

In addition, in the above-mentioned manufacturing method, after the above-mentioned rolling, an annealing treatment may be further performed that heats the above-mentioned aluminum plate at a temperature of 200° C. or higher and 350° C. or lower. In this situation, residual strain in the aluminum plate, which tends to become a cause of abnormal discharges, can be eliminated.

There is a risk that, in situations in which the annealing treatment is performed below 200° C., the effect of the annealing treatment cannot be obtained, and in situations in which the annealing treatment is performed at a temperature that exceeds 350° C., the crystal grains will coarsen during the annealing treatment owing to secondary recrystallization, and thereby the crystal-grain diameter stipulations cannot be satisfied. It is noted that the hold time of the heat treatment is not particularly prescribed; however, from the viewpoint of production efficiency and economy, it is ideal to set it to within 10 h. There is no particular need to prescribe a lower limit for the hold time.

It is noted that, when manufacturing a sputtering-target material using a sputtering-target aluminum plate obtained by the present invention, a preexisting known method should be used.

Working Examples

Working examples, together with comparative examples, of the present invention are described below. It is noted that the working examples below are for the purpose of explaining the effects of the present invention, and the technical scope of the present invention is not limited by the processes and conditions described in the working examples.

First, ingots composed of industrial, high-purity aluminum having a purity of 99.999 mass % or more were prepared; the ingots were rolled in accordance with the conditions shown in Table 1, and thereby aluminum plates (samples A1-A25, B1-B10) having a thickness of 10-26 mm were obtained. In addition, after the final pass of the rolling was performed, some of the samples underwent final annealing under the conditions shown in Table 1. It is noted that samples A1-A25 satisfied the stipulations according to the present invention, and samples B1-B10 did not satisfy the stipulations according to the present invention.

Samples A10, A14, A20, A22, and B6 are ones for which only one pass of the rolling process was performed. With A6, A11, A18, A21, A22, B2-B4, and B10, the final annealing was not performed. In addition, the value calculated by substituting the rolling-end temperature T in the final pass of the rolling in the right side of formula (15) above was entered in the "Formula (15)" column in Table 1, and the value calculated by substituting the rolling-end temperature T in the right side of formula (30) above is entered in the "Formula (30)" column.

The rolling process was performed using a reversible-type, two-stage rolling mill having a roll diameter of 450 mm. With regard to the large rolling-reduction condition, bite failures were prevented by processing, in advance, the tip of the rolling material into a wedge shape, that is, a shape in which the plate thickness becomes thinner as it goes toward the tip. It is noted that the rolling reductions, temperatures, and the like shown in Table 1 are values of constant regions, not the regions processed into wedge shapes, and the other various measurement results in Table 2 and Table 3 are also values corresponding to constant regions.

For each aluminum plate (hereinbelow, called an "original plate") manufactured in accordance with the conditions in Table 1, the average crystal-grain diameter d and the crystal-plane area ratios B were measured at each of these locations: the plate surface, a depth of $1/4^{th}$ of the plate thickness, and a depth of $1/2$ of the plate thickness. The measurement results of the average crystal-grain diameter d at each measurement location, the ratios of the average crystal-grain diameters d, and the ratios of the crystal-plane area ratios B were as shown in Table 2. It is noted that, because the rolling-end temperature of sample B3 was low, it had an unrecrystallized structure.

Figure 1B:
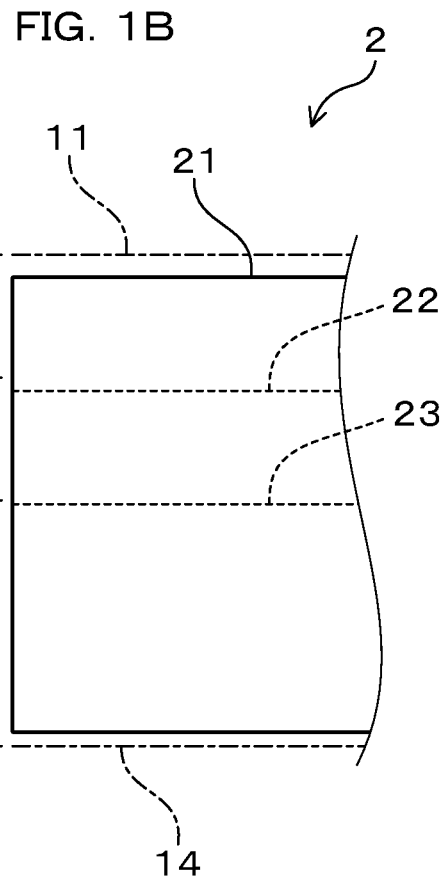

Next, as shown in FIG. 1, a cutting process was performed on one plate surface 11 and on another plate surface 14 of an original plate 1, and thereby a sputtering-target material 2 was manufactured. The average crystal-grain diameter D and the crystal-plane area ratios A were measured at each of the following locations of the sputtering-target material 2: a front-side surface 21, a depth of $1/4^{th}$ of the plate thickness 22, and a depth of $1/2$ of the plate thickness 23, which are shown in FIG. 1(b). The measurement results of the average crystal-grain diameter D at each measurement location, the ratio of the average crystal-grain diameters D at the measurement locations, and the ratio of the crystal-plane area ratios A at the measurement locations were as shown in Table 3. It is noted that, for the sake of convenience below, the one plate surface 11 of the original plate 1 may be called the "front-side surface 11," and the other plate surface 14 may be called the "rear-side surface 14."

Furthermore, film-thickness variations due to sputtering and the occurrence of abnormal discharges due to sputtering were evaluated using these sputtering-target materials, and the evaluation results thereof are shown in Table 3.

It is noted that the sputtering-target material 2 was manufactured by performing the cutting process on the front-side surface 11 and the rear-side surface 14 of the original plate 1, as described above. Consequently, the plate thickness of the sputtering-target material 2 differs from that of the original plate 1. In addition, as shown in FIG. 1, the front-side surface 21, the location having a depth of $1/4^{th}$ of the plate thickness 22, and the location having a depth of $1/2$ of the plate thickness 23 of the sputtering-target material 2 differ from the front-side surface 11, a location having a depth of $1/4^{th}$ of the plate thickness 12, and a location having a depth of $1/2$ of the plate thickness 13 of the original plate 1.

The methods of measuring the average crystal-grain diameters D and d and the crystal-plane area ratios A and B were as described above. In addition, the evaluation conditions of the film-thickness variations and the abnormal discharges due to sputtering were as below.

First, a cut-out process and a cutting process were performed on each original plate 1, and thereby each sputtering-target material 2 was obtained. Specifically, with regard to an original plate (sample A15) having a plate thickness of 26 mm, the front-side surface 11 of the original plate 1 was cut by 2 mm in the cutting process, and the rear-side surface 14 was cut by 4.3 mm. In addition, with regard to original plates 1 (samples A1-A14, A17-A25, B1-B10) having a plate thickness of 13 mm and an original plate 1 (sample A16) having a plate thickness of 10 mm, the front-side surface 11 of the original plate 1 was cut by 1 mm in the cutting process, and the rear-side surface 14 was cut by 0.3 mm. After these cutting processes were performed, sputtering was started up from the front-side surface 21, each target material 2 was mounted on a backing plate, and thus the sputtering targets were manufactured.

Sputter deposition onto a dummy substrate and sputter deposition onto an evaluation substrate were alternately performed using these sputtering targets. Furthermore, two types of evaluation substrates were manufactured: an evaluation substrate on which an aluminum film was formed in the initial stage of consumption when the amount of the target material consumed is small; and an evaluation substrate on which an aluminum film was formed in the late stage of consumption when the amount of the target material consumed is large.

Specifically, in the initial sputter deposition onto the dummy substrate, the sputtering time was set to 0.1 h. In the initial sputter deposition onto the evaluation substrate, the sputtering time was set to 55 s.

In the second sputter deposition onto the dummy substrate, the sputtering time was changed in accordance with the plate thickness of the original plate. That is, with regard to samples A1-A14, A17-A25, B1-B10, in which the plate thickness of the original plate was 13 mm, the sputtering time was set to 65 h. With regard to sample A15, in which the plate thickness of the original plate was 26 mm, the sputtering time was set to 115 h. With regard to sample A16, in which the plate thickness of the original plate was 10 mm, the sputtering time was set to 45 h.

In the second sputter deposition onto the evaluation substrate, the sputtering time was set to 55 s.

Figure 2A:
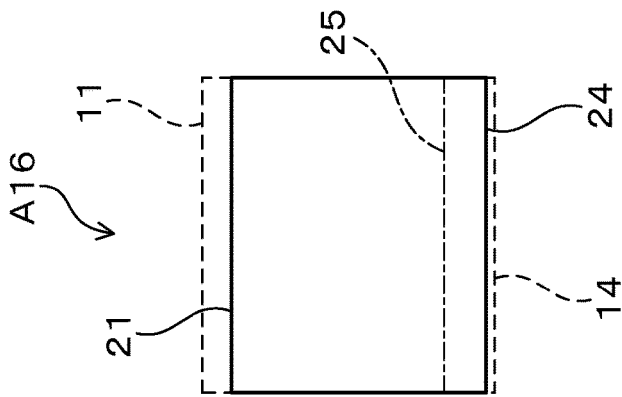
FIG. 2 is a cross-sectional view according to the working example, in which (a) shows a sputtering location of sample A1, (b) shows a sputtering location of sample A15, and (c) shows a sputtering location of sample A16.
Figure 2B:
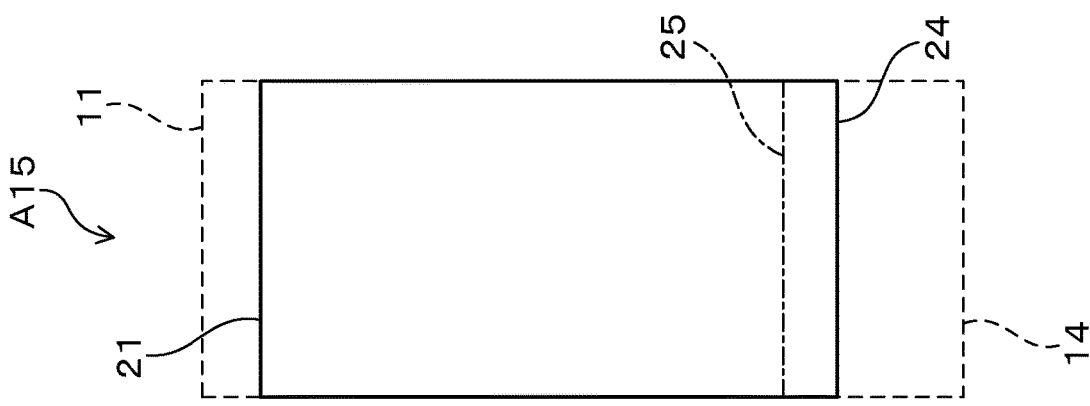
Figure 2C:
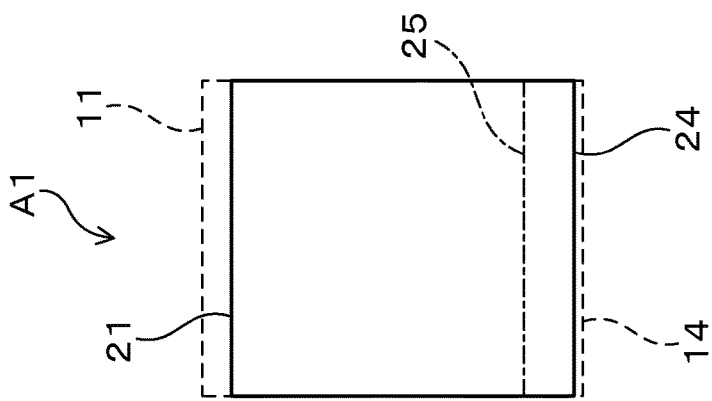

Sputtering-target-material regions and sputtering-evaluation regions of the original plate of each sample are shown in FIG. 2. Symbol 11 and symbol 14 in FIG. 2 are the front-side surface and the rear-side surface, respectively, of the original plate 1. In addition, symbol 21 and symbol 24 are the front-side surface of the sputtering-target material 2 (i.e., the surface that is being sputtered) and the rear-side surface after the cutting process has been performed, respectively.

Symbol 25 is the location of the sputtering surface at the point in time when the second sputter deposition onto the evaluation substrate has been completed. With regard to samples A1-A14, A17-A25, B1-B10, in which the plate thickness of the original plate is 13 mm, the total sputtering amount was 10 mm. With regard to sample A15, in which the plate thickness of the original plate was 26 mm, the total sputtering amount was 17.8 mm. With regard to sample A16, in which the plate thickness of the original plate was 10 mm, the total sputtering amount was 7.2 mm.

It is noted that the sputtering-evaluation apparatus and the sputtering conditions other than the sputtering times were as below.

Sputtering Apparatus: Endura 5500 PVD (made by Applied Materials Inc.)
Sputter Power: 10 kW
Argon Flow Rate: 21 sccm
Substrate Temperature: Unheated
Evaluation Substrate: Si wafer In the initial sputter deposition onto the evaluation substrate, an initial state, in which the amount of the sputtering-target material 2 consumed was small, was reproduced; and in the second sputter deposition onto the evaluation substrate, a late-stage state, in which consumption had progressed, was reproduced.

In addition, while sputtering was being performed, the number of abnormal discharges was counted using a micro-arc monitor (made by Landmark Technology Co., Ltd.). Furthermore, symbol "A" was entered in the "Abnormal-Discharge Count" column in Table 3 in the situation in which the total number of abnormal discharges that occurred in the interval from the start of the initial sputter deposition onto the dummy substrate until the completion of the second sputter deposition onto the evaluation substrate was 3 or fewer; symbol "B" was entered in situations in which the total number of abnormal discharges was 4-5; and symbol "C" was entered in situations in which the total number of abnormal discharges was 6 times or more. In the abnormal-discharge evaluation, the cases of symbols A, B, in which the total abnormal-discharge count was five or fewer, were judged as acceptable because abnormal discharges were sufficiently inhibited, and the cases of symbol C, in which the total abnormal-discharge count was 6 times or more, were judged as unacceptable because abnormal discharges readily occur.

In addition, the film-thickness distribution of the aluminum films formed by the sputtering depositions was evaluated based on the film-thickness values, which were converted from the electrical-resistance measurements using the four-terminal method. The film-thickness measurements were performed at 49 points within each substrate. Furthermore, based on the maximum value $X_{max}$ [μm] and the minimum value $X_{min}$ [μm] among these values, the film-thickness variation $s_X$ [%] was calculated using formula (31) below.

$$s_X = \{(X_{max} - X_{min})/(X_{max} + X_{min})\} \times 100 \quad (31)$$

Symbol "A" was entered in the "Film-Thickness Variation" column in Table 3 in situations in which the value of the film-thickness variation $s_X$ was 5% or less; symbol "B+" was entered in situations in which the value was greater than 5% and 5.5% or less; symbol "B" was entered in situations in which the value was greater than 5.5% and 6.5% or less; and symbol "C" was entered in situations in which the value was greater than 6.5%. In the evaluation of film-thickness variation, the cases of symbols A, B+, B, in which the film-thickness variation values were 6.5% or less, were judged as acceptable because the film-thickness variation was sufficiently small, and the cases of symbol C, in which the film-thickness variation value was greater than 6.5%, were judged as unacceptable because the film-thickness variation was large.

TABLE 1

| | | | | Except for Final Pass | | Final Pass | | | | Final Annealing | |
|---|---|---|---|---|---|---|---|---|---|---|---|
| Sample Symbol | Total Rolling Reduction (%) | Final Plate Thickness (mm) | Rolling Start Temp (° C.) | Rolling Reduction Range (%) | Rolling End Plate Temp Range (° C.) | Rolling Reduction R (%) | Rolling End Temp T (° C.) | Formula (15) | Formula (30) | Temp (° C.) | Hold Time (h) |
| A1 | 91.3 | 13 | 500 | 20.0-45.8 | 470-130 | 60.0 | 150 | 57.8 | 62.8 | 250 | 5 |
| A2 | 87.0 | 13 | 400 | 13.3-25.0 | 380-130 | 62.5 | 150 | 57.8 | 62.8 | 200 | 0.1 |
| A3 | 91.3 | 13 | 300 | 13.3-31.6 | 280-220 | 52.5 | 200 | 52.2 | 57.2 | 350 | 0.1 |
| A4 | 89.6 | 13 | 400 | 28.0-51.8 | 360-200 | 55.0 | 200 | 52.2 | 57.2 | 300 | 2 |
| A5 | 91.3 | 13 | 300 | 13.3-60.9 | 280-250 | 52.5 | 250 | 51.0 | 56.0 | 200 | 10 |
| A6 | 87.0 | 13 | 300 | 20.0-33.3 | 280-250 | 55.0 | 250 | 51.0 | 56.0 | None | |
| A7 | 91.3 | 13 | 400 | 13.3-28.6 | 370-330 | 55.0 | 300 | 54.2 | 59.2 | 250 | 5 |
| A8 | 89.6 | 13 | 500 | 9.5-36.4 | 450-310 | 57.5 | 300 | 54.2 | 59.2 | 200 | 2 |
| A9 | 91.3 | 13 | 150 | 13.3-30.8 | 180-130 | 65.0 | 150 | 57.8 | 62.8 | 300 | 2 |
| A10 | 65.0 | 13 | 150 | — | — | 65.0 | 150 | 57.8 | 62.8 | 250 | 5 |
| A11 | 91.3 | 13 | 150 | 13.3-33.3 | 180-120 | 70.0 | 150 | 57.8 | 62.8 | None | |
| A12 | 91.3 | 13 | 250 | 13.3-56.3 | 230-210 | 57.5 | 200 | 52.2 | 57.2 | 350 | 0.1 |
| A13 | 87.0 | 13 | 250 | 20.0-45.8 | 230-220 | 60.0 | 200 | 52.2 | 57.2 | 250 | 5 |
| A14 | 60.0 | 13 | 250 | — | — | 60.0 | 200 | 52.2 | 57.2 | 250 | 5 |
| A15 | 82.7 | 26 | 400 | 13.3-23.1 | 390-210 | 60.0 | 200 | 52.2 | 57.2 | 250 | 5 |
| A16 | 93.3 | 10 | 400 | 13.3-38.5 | 380-210 | 60.0 | 200 | 52.2 | 57.2 | 250 | 5 |
| A17 | 89.6 | 13 | 300 | 20.0-56.6 | 280-200 | 70.0 | 200 | 52.2 | 57.2 | 300 | 1 |
| A18 | 91.3 | 13 | 300 | 12.5-33.3 | 280-270 | 57.5 | 250 | 51.0 | 56.0 | None | |
| A19 | 87.0 | 13 | 300 | 20.0-45.8 | 280-260 | 60.0 | 250 | 51.0 | 56.0 | 250 | 1 |
| A20 | 60.0 | 13 | 300 | — | — | 60.0 | 250 | 51.0 | 56.0 | 200 | 2 |
| A21 | 91.3 | 13 | 500 | 10.0-51.8 | 460-260 | 70.0 | 250 | 51.0 | 56.0 | None | |
| A22 | 70.0 | 13 | 300 | — | — | 70.0 | 250 | 51.0 | 56.0 | None | |
| A23 | 91.3 | 13 | 400 | 3.3-37.5 | 380-320 | 60.0 | 300 | 54.2 | 59.2 | 200 | 10 |
| A24 | 91.3 | 13 | 300 | 6.7-53.6 | 300-270 | 65.0 | 300 | 54.2 | 59.2 | 250 | 2 |
| A25 | 87.0 | 13 | 400 | 20.0-27.7 | 380-310 | 70.0 | 300 | 54.2 | 59.2 | 300 | 1 |
| B1 | 87.0 | 13 | 200 | 20.0-56.7 | 180-130 | 50.0 | 150 | 57.8 | 62.8 | 250 | 5 |
| B2 | 87.0 | 13 | 400 | 10.0-27.8 | 380-130 | 55.0 | 150 | 57.8 | 62.8 | None | |
| B3 | 87.0 | 13 | 300 | 10.0-27.8 | 280-110 | 55.0 | 125 | 62.2 | 67.2 | None | |
| B4 | 87.0 | 13 | 550 | 20.0-56.7 | 520-360 | 55.0 | 325 | 57.5 | 62.5 | None | |
| B5 | 91.3 | 13 | 300 | 3.3-56.3 | 260-130 | 57.5 | 150 | 57.8 | 62.8 | 250 | 1 |
| B6 | 57.5 | 13 | 200 | — | — | 57.5 | 150 | 57.8 | 62.8 | 300 | 1 |
| B7 | 89.6 | 13 | 400 | 13.3-25.0 | 380-200 | 50.0 | 200 | 52.2 | 57.2 | 200 | 5 |
| B8 | 91.3 | 13 | 300 | 13.3-40.0 | 280-260 | 50.0 | 250 | 51.0 | 56.0 | 350 | 0.1 |
| B9 | 89.6 | 13 | 400 | 20.0-60.0 | 380-280 | 50.0 | 300 | 54.2 | 59.2 | 250 | 2 |
| B10 | 87.0 | 13 | 500 | 20.0-54.4 | 460-320 | 52.5 | 300 | 54.2 | 59.2 | None | |

TABLE 2

| Sample Symbol | Average Crystal-Grain Diameter d | | | | | Crystal-Plane Area Ratio B | | | | | | | |
|---|---|---|---|---|---|---|---|---|---|---|---|---|---|
| | $d_s$ (μm) | $d_q$ (μm) | $d_c$ (μm) | $d_q/d_s$ | $d_c/d_s$ | $B_{001q}/B_{001s}$ | $B_{001c}/B_{001s}$ | $B_{123q}/B_{123s}$ | $B_{123c}/B_{123s}$ | $B_{011c}/B_{011s}$ | $B_{111c}/B_{111s}$ | $B_{112c}/B_{112s}$ | $B_{113c}/B_{113s}$ |
| A1 | 215 | 275 | 290 | 1.28 | 1.35 | 1.70 | 2.30 | 0.80 | 0.70 | 1.00 | 0.80 | 0.95 | 0.95 |
| A2 | 215 | 265 | 295 | 1.23 | 1.37 | 1.75 | 2.45 | 0.80 | 0.55 | 1.00 | 0.60 | 0.85 | 1.00 |
| A3 | 220 | 275 | 300 | 1.25 | 1.36 | 1.65 | 2.15 | 0.85 | 0.70 | 1.00 | 0.95 | 0.95 | 0.95 |
| A4 | 215 | 270 | 295 | 1.26 | 1.37 | 1.95 | 2.45 | 0.80 | 0.55 | 0.85 | 0.70 | 0.95 | 0.95 |
| A5 | 210 | 260 | 290 | 1.24 | 1.38 | 1.60 | 2.15 | 0.85 | 0.60 | 0.95 | 0.90 | 1.00 | 1.05 |
| A6 | 220 | 265 | 300 | 1.20 | 1.36 | 1.80 | 2.40 | 0.80 | 0.55 | 0.95 | 0.75 | 0.85 | 0.85 |
| A7 | 215 | 270 | 295 | 1.26 | 1.37 | 1.85 | 2.45 | 0.85 | 0.55 | 0.95 | 0.60 | 0.85 | 0.95 |
| A8 | 210 | 260 | 290 | 1.24 | 1.38 | 1.95 | 2.35 | 0.80 | 0.55 | 0.85 | 0.65 | 0.90 | 0.85 |
| A9 | 70 | 135 | 190 | 1.93 | 2.71 | 4.80 | 7.50 | 0.65 | 0.20 | 0.70 | 0.55 | 0.55 | 0.75 |
| A10 | 65 | 125 | 170 | 1.92 | 2.62 | 6.30 | 8.60 | 0.60 | 0.35 | 0.55 | 0.55 | 0.65 | 0.75 |
| A11 | 35 | 90 | 115 | 2.57 | 3.29 | 32.00 | 47.50 | 0.05 | 0.05 | 0.10 | $4 \times 10^{-3}$ | 0.01 | 0.15 |
| A12 | 190 | 260 | 290 | 1.37 | 1.53 | 3.50 | 3.50 | 0.65 | 0.55 | 0.95 | 0.60 | 0.80 | 0.95 |
| A13 | 90 | 145 | 205 | 1.61 | 2.28 | 15.35 | 22.45 | 0.25 | 0.05 | 0.35 | 0.02 | 0.05 | 0.40 |
| A14 | 75 | 140 | 180 | 1.87 | 2.40 | 20.20 | 25.70 | 0.30 | 0.20 | 0.25 | 0.05 | 0.02 | 0.30 |
| A15 | 60 | 130 | 200 | 2.17 | 3.33 | 14.35 | 20.85 | 0.35 | 0.15 | 0.30 | 0.10 | 0.05 | 0.35 |
| A16 | 75 | 145 | 175 | 1.93 | 2.33 | 18.20 | 29.50 | 0.30 | 0.20 | 0.20 | 0.10 | 0.03 | 0.25 |
| A17 | 45 | 140 | 165 | 3.11 | 3.67 | 8.50 | 15.30 | 0.50 | 0.10 | 0.20 | 0.10 | 0.10 | 0.25 |
| A18 | 180 | 255 | 280 | 1.42 | 1.56 | 3.23 | 3.85 | 0.75 | 0.35 | 0.85 | 0.75 | 0.95 | 0.95 |
| A19 | 50 | 145 | 165 | 2.90 | 3.30 | 13.50 | 22.95 | 0.25 | 0.10 | 0.45 | 0.30 | 0.40 | 0.55 |
| A20 | 55 | 145 | 190 | 2.64 | 3.45 | 26.50 | 38.40 | 0.10 | 0.15 | 0.60 | 0.20 | 0.25 | 0.50 |
| A21 | 40 | 110 | 155 | 2.75 | 3.88 | 26.30 | 27.55 | 0.15 | 0.25 | 0.40 | 0.30 | 0.10 | 0.60 |
| A22 | 40 | 110 | 155 | 2.75 | 3.88 | 16.80 | 29.10 | 0.45 | 0.15 | 0.55 | 0.45 | 0.45 | 0.55 |
| A23 | 165 | 250 | 300 | 1.52 | 1.82 | 4.50 | 3.60 | 0.70 | 0.40 | 0.95 | 0.75 | 0.85 | 0.95 |
| A24 | 135 | 190 | 240 | 1.41 | 1.78 | 3.50 | 3.00 | 0.65 | 0.40 | 0.95 | 0.75 | 0.90 | 0.90 |
| A25 | 110 | 155 | 210 | 1.41 | 1.91 | 2.65 | 4.50 | 0.65 | 0.50 | 0.75 | 0.40 | 0.80 | 0.75 |
| B1 | 315 | 325 | 330 | 1.03 | 1.05 | 1.10 | 1.20 | 1.00 | 0.90 | 1.20 | 1.20 | 1.05 | 0.95 |
| B2 | 315 | 320 | 330 | 1.02 | 1.05 | 1.05 | 1.10 | 1.00 | 0.90 | 1.15 | 1.20 | 1.10 | 0.95 |
| B3 | | | | | | Unrecrystallized structure | | | | | | | |
| B4 | 375 | 385 | 390 | 1.01 | 1.03 | 1.05 | 1.15 | 1.00 | 0.95 | 1.15 | 1.20 | 1.10 | 0.95 |
| B5 | 285 | 320 | 335 | 1.12 | 1.18 | 1.05 | 1.15 | 0.95 | 0.90 | 1.15 | 0.75 | 1.20 | 0.95 |
| B6 | 310 | 310 | 310 | 1.00 | 1.00 | 1.15 | 1.20 | 1.00 | 0.85 | 1.05 | 1.20 | 0.95 | 1.00 |
| B7 | 250 | 280 | 310 | 1.12 | 1.24 | 1.25 | 1.75 | 0.95 | 0.80 | 0.95 | 0.80 | 1.00 | 1.10 |
| B8 | 250 | 260 | 285 | 1.04 | 1.14 | 1.35 | 1.85 | 0.90 | 0.70 | 1.00 | 1.00 | 1.00 | 0.95 |
| B9 | 245 | 265 | 305 | 1.08 | 1.24 | 1.45 | 1.80 | 0.90 | 0.75 | 0.95 | 0.85 | 0.95 | 1.00 |
| B10 | 245 | 265 | 300 | 1.08 | 1.22 | 1.45 | 1.85 | 0.90 | 0.70 | 0.95 | 0.75 | 0.95 | 1.00 |

TABLE 3

| Sample Symbol | Average Crystal-Grain Diameter D | | | | | Crystal-Plane Area Ratio A | | | | | | | | Abnormal-Discharge Count | Film-Thickness Variation |
|---|---|---|---|---|---|---|---|---|---|---|---|---|---|---|---|
| | $D_s$ (μm) | $D_q$ (μm) | $D_c$ (μm) | $D_q/D_s$ | $D_c/D_s$ | $A_{001q}/A_{001s}$ | $A_{001c}/A_{001s}$ | $A_{123q}/A_{123s}$ | $A_{123c}/A_{123s}$ | $A_{011c}/A_{011s}$ | $A_{111c}/A_{111s}$ | $A_{112c}/A_{112s}$ | $A_{113c}/A_{113s}$ | | |
| A1 | 220 | 280 | 290 | 1.27 | 1.32 | 1.60 | 2.10 | 0.80 | 0.70 | 1.05 | 0.90 | 0.95 | 1.00 | B | B |
| A2 | 215 | 275 | 295 | 1.28 | 1.37 | 1.70 | 2.30 | 0.80 | 0.55 | 1.00 | 0.70 | 0.90 | 1.05 | B | B |
| A3 | 230 | 280 | 300 | 1.22 | 1.30 | 1.50 | 2.00 | 0.85 | 0.70 | 1.05 | 1.05 | 0.95 | 0.95 | B | B |
| A4 | 220 | 275 | 290 | 1.25 | 1.32 | 1.95 | 2.45 | 0.80 | 0.55 | 0.85 | 0.75 | 1.00 | 0.95 | B | B |
| A5 | 220 | 265 | 290 | 1.20 | 1.32 | 1.45 | 1.95 | 0.85 | 0.65 | 0.95 | 1.00 | 1.05 | 1.10 | B | B |
| A6 | 225 | 270 | 300 | 1.20 | 1.33 | 1.80 | 2.35 | 0.80 | 0.60 | 1.00 | 0.80 | 0.90 | 0.90 | B | B |
| A7 | 225 | 275 | 295 | 1.22 | 1.31 | 1.75 | 2.40 | 0.85 | 0.55 | 1.05 | 0.70 | 0.90 | 0.95 | B | B |
| A8 | 215 | 260 | 285 | 1.21 | 1.33 | 1.90 | 2.30 | 0.80 | 0.55 | 0.90 | 0.70 | 0.90 | 0.90 | B | B |
| A9 | 80 | 150 | 180 | 1.88 | 2.25 | 4.10 | 6.25 | 0.70 | 0.30 | 0.75 | 0.65 | 0.60 | 0.80 | A | A |
| A10 | 70 | 130 | 160 | 1.86 | 2.29 | 5.20 | 6.05 | 0.65 | 0.40 | 0.65 | 0.55 | 0.65 | 0.75 | A | A |
| A11 | 40 | 100 | 110 | 2.50 | 2.75 | 30.50 | 45.00 | 0.10 | 0.05 | 0.10 | $3 \times 10^{-3}$ | 0.01 | 0.15 | A | A |
| A12 | 205 | 270 | 290 | 1.32 | 1.41 | 2.00 | 2.50 | 0.75 | 0.55 | 0.95 | 0.70 | 0.95 | 0.95 | A | B+ |
| A13 | 100 | 160 | 200 | 1.60 | 2.00 | 11.00 | 17.50 | 0.35 | 0.10 | 0.40 | 0.02 | 0.05 | 0.45 | A | A |
| A14 | 85 | 150 | 180 | 1.76 | 2.12 | 16.50 | 23.50 | 0.40 | 0.25 | 0.35 | 0.05 | 0.03 | 0.40 | A | A |
| A15 | 80 | 130 | 160 | 1.63 | 2.00 | 10.20 | 13.50 | 0.65 | 0.45 | 0.55 | 0.20 | 0.30 | 0.50 | A | A |
| A16 | 85 | 140 | 180 | 1.65 | 2.12 | 16.50 | 24.00 | 0.35 | 0.25 | 0.35 | 0.10 | 0.05 | 0.35 | A | A |
| A17 | 50 | 145 | 165 | 2.90 | 3.30 | 7.85 | 12.65 | 0.55 | 0.20 | 0.30 | 0.10 | 0.10 | 0.35 | A | A |
| A18 | 190 | 260 | 280 | 1.37 | 1.47 | 2.15 | 2.45 | 0.75 | 0.50 | 0.90 | 0.75 | 1.00 | 0.95 | A | B+ |
| A19 | 60 | 150 | 165 | 2.50 | 2.75 | 10.50 | 20.00 | 0.30 | 0.15 | 0.50 | 0.35 | 0.40 | 0.65 | A | A |
| A20 | 70 | 155 | 180 | 2.21 | 2.57 | 25.50 | 33.50 | 0.20 | 0.20 | 0.70 | 0.25 | 0.30 | 0.50 | A | A |
| A21 | 45 | 115 | 145 | 2.56 | 3.22 | 18.50 | 25.00 | 0.20 | 0.35 | 0.50 | 0.40 | 0.20 | 0.60 | A | A |
| A22 | 50 | 120 | 150 | 2.40 | 3.00 | 14.50 | 27.00 | 0.50 | 0.25 | 0.60 | 0.45 | 0.50 | 0.70 | A | A |
| A23 | 180 | 270 | 290 | 1.50 | 1.61 | 2.10 | 2.55 | 0.75 | 0.50 | 0.95 | 0.80 | 0.90 | 1.00 | A | B+ |
| A24 | 150 | 200 | 230 | 1.33 | 1.53 | 2.05 | 2.60 | 0.65 | 0.45 | 1.00 | 0.75 | 0.95 | 0.90 | A | B+ |
| A25 | 120 | 160 | 200 | 1.33 | 1.67 | 2.05 | 2.50 | 0.70 | 0.50 | 0.80 | 0.50 | 0.80 | 0.80 | A | A |
| B1 | 320 | 325 | 330 | 1.02 | 1.03 | 1.05 | 1.10 | 1.00 | 0.90 | 1.20 | 1.30 | 1.10 | 0.95 | C | C |
| B2 | 315 | 320 | 330 | 1.02 | 1.05 | 1.05 | 1.10 | 1.00 | 0.95 | 1.20 | 1.20 | 1.15 | 1.00 | C | C |

TABLE 3-continued

| Sample Symbol | Average Crystal-Grain Diameter D | | | | | Crystal-Plane Area Ratio A | | | | | | | | Abnormal-Discharge Count | Film-Thickness Variation |
| --- | --- | --- | --- | --- | --- | --- | --- | --- | --- | --- | --- | --- | --- | --- | --- |
| | $D_s$ (μm) | $D_q$ (μm) | $D_c$ (μm) | $D_q/D_s$ | $D_c/D_s$ | $A_{001q}/A_{001s}$ | $A_{001c}/A_{001s}$ | $A_{123q}/A_{123s}$ | $A_{123c}/A_{123s}$ | $A_{011c}/A_{011s}$ | $A_{111c}/A_{111s}$ | $A_{112c}/A_{112s}$ | $A_{113c}/A_{113s}$ | | |
| B3 | Unrecrystallized structure | | | | | | | | | | | | | C | C |
| B4 | 380 | 385 | 390 | 1.01 | 1.03 | 1.05 | 1.10 | 1.05 | 0.95 | 1.20 | 1.25 | 1.20 | 0.95 | C | C |
| B5 | 290 | 325 | 330 | 1.12 | 1.14 | 1.05 | 1.20 | 0.95 | 0.90 | 1.10 | 0.80 | 1.20 | 0.95 | C | C |
| B6 | 310 | 315 | 310 | 1.02 | 1.00 | 1.10 | 1.00 | 0.95 | 0.85 | 1.05 | 1.25 | 0.95 | 1.00 | C | C |
| B7 | 260 | 285 | 305 | 1.10 | 1.17 | 1.15 | 1.50 | 0.95 | 0.80 | 1.00 | 0.90 | 1.00 | 1.20 | C | C |
| B8 | 255 | 265 | 285 | 1.04 | 1.12 | 1.30 | 1.65 | 0.90 | 0.75 | 1.00 | 1.00 | 0.95 | 0.95 | C | C |
| B9 | 255 | 270 | 300 | 1.06 | 1.18 | 1.35 | 1.70 | 0.95 | 0.75 | 0.95 | 0.80 | 0.95 | 1.05 | C | C |
| B10 | 250 | 270 | 290 | 1.08 | 1.16 | 1.40 | 1.80 | 0.90 | 0.70 | 0.95 | 0.75 | 0.95 | 1.10 | C | C |

With the sputtering-target materials composed of samples A1-A25, in which the average crystal-grain diameter stipulations according to the present invention were satisfied, the number of occurrences of abnormal discharges from the initial stage to the last stage of sputtering was five or fewer, and therefore the occurrence of abnormal discharges could be sufficiently inhibited. In addition, among these samples, with the sputtering-target materials composed of samples A9-A25, in which the average crystal-grain diameters satisfied the stipulations of formula (16) to formula (20) above, the number of occurrences of abnormal discharges was three or fewer, and therefore the occurrence of abnormal discharges could be more effectively inhibited. On the other hand, with the sputtering-target materials composed of samples B1-B10, in which the average crystal-grain diameter stipulations according to the present invention were not satisfied, the number of occurrences of abnormal discharges exceeded five, and there were numerous occurrences of abnormal discharges.

In addition, with the sputtering-target materials composed of samples A1-A25, the film-thickness variation from the initial stage to the last stage of sputtering was within 6.5%, and therefore the film-thickness variation could be sufficiently reduced. In addition, among these samples, samples A12, A18, A23-A24, in which the crystal-plane stipulations were satisfied in addition to the average crystal-grain diameter stipulations, were within 5.5%, and samples A9-A11, A13-A17, A19-A22, A25 were within 5%; thus, film-thickness variation could be further reduced. On the other hand, with the sputtering-target materials composed of samples B1-B10, the film-thickness variation, which exceeded 6.5%, was large.

In addition, with the sputtering-target material composed of samples A9-A25, which satisfied more suitable rolling conditions, a much greater effect of inhibiting abnormal discharges and film-thickness variation could be confirmed.

As can be understood from the results above, by virtue of the crystal-grain diameters and the crystal planes being controlled, in modes different from those of the past, local depletion during sputtering could be inhibited in the sputtering-target aluminum plates and the sputtering-target materials obtained by the present invention. Furthermore, by also inhibiting abnormal discharges, it is possible, while reducing production losses, to make the thickness of the formed metal film uniform and of low resistance even in the case of consumption over a long time. In addition, by virtue of the rolling conditions being strictly prescribed, it is possible to stably and efficiently obtain sputtering-target aluminum plates having the above-mentioned excellent characteristics.

EXPLANATION OF THE REFERENCE NUMBERS

1 Aluminum plate
11 Plate surface
12 Location having a depth of ¼$^{th}$ of the plate thickness
13 Location having a depth of ½ of the plate thickness
2 Target material
21 Plate surface
22 Location having a depth of ¼$^{th}$ of the plate thickness
23 Location having a depth of ½ of the plate thickness

The invention claimed is:

1. A sputtering-target material plate composed of:
aluminum having a purity of 99.999 mass % or higher and unavoidable impurities;
wherein, when an average crystal-grain diameter at the plate surface is given as $D_s$ [μm], an average crystal-grain diameter at a depth of ¼$^{th}$ of the plate thickness is given as $D_q$ [μm], and an average crystal-grain diameter at a depth of ½ of the plate thickness is given as $D_c$ [μm], formula (1) to formula (5) below are satisfied, and the average crystal-grain diameter changes continuously in a plate-thickness direction:

$$D_s \leq 230 \quad (1),$$

$$D_q \leq 280 \quad (2),$$

$$D_c \leq 300 \quad (3),$$

$$1.2 \leq D_q/D_s \quad (4), \text{ and}$$

$$1.3 \leq D_c/D_s \quad (5).$$

2. The sputtering-target material plate according to claim 1, wherein:
when an area ratio of the {001} plane at the plate surface is given as $A_{001s}$, an area ratio of the {001} plane at a depth of ¼$^{th}$ of the plate thickness is given as $A_{001q}$, and an area ratio of the {001} plane at a depth of ½ of the plate thickness is given as $A_{001c}$, formula (6) and formula (7) below are further satisfied:

$$1.5 \leq A_{001q}/A_{001s} \quad (6), \text{ and}$$

$$2.0 \leq A_{001c}/A_{001s} \quad (7).$$

3. The sputtering-target material plate according to claim 1, wherein:
when an area ratio of the {123} plane at the plate surface is given as $A_{123s}$, an area ratio of the {123} plane at a depth of ¼$^{th}$ of the plate thickness is given as $A_{123q}$, and an area ratio of the {123} plane at a depth of ½ of the plate thickness is given as $A_{123c}$, formula (8) and formula (9) below are further satisfied:

$$0 < A_{123q}/A_{123s} \leq 0.85 \quad (8), \text{ and}$$

$$0 < A_{123c}/A_{123s} \leq 0.65 \quad (9).$$

4. The sputtering-target material plate according to claim 2, wherein:
when an area ratio of the {011} plane at the plate surface is given as $A_{011s}$ and an area ratio of the {011} plane at a depth of ½ of the plate thickness is given as $A_{011c}$, formula (10) below is further satisfied:

$$0 < A_{011c}/A_{011s} \leq 0.9 \quad (10).$$

5. The sputtering-target material plate according to claim 2, wherein:
when an area ratio of the {111} plane at the plate surface is given as $A_{111s}$ and an area ratio of the {111} plane at a depth of ½ of the plate thickness is given as $A_{111c}$, formula (11) below is further satisfied:

$$0 < A_{111c}/A_{111s} \leq 0.7 \quad (11).$$

6. The sputtering-target material plate according to claim 2, wherein:
when an area ratio of the {112} plane at the plate surface is given as $A_{112s}$ and an area ratio of the {112} plane at a depth of ½ of the plate thickness is given as $A_{112c}$, formula (12) below is further satisfied:

$$0 < A_{112c}/A_{112s} \leq 0.9 \quad (12).$$

7. The sputtering-target material plate according to claim 2, wherein:
when an area ratio of the {113} plane at the plate surface is given as $A_{113s}$ and an area ratio of the {113} plane at a depth of ½ of the plate thickness is given as $A_{113c}$, formula (13) below is further satisfied:

$$0 < A_{113c}/A_{113s} \leq 0.9 \quad (13).$$

8. A sputtering target composed of:
the sputtering-target material plate according to claim 1.

9. A sputtering-target aluminum plate composed of:
aluminum having a purity of 99.999 mass % or higher and unavoidable impurities;
wherein, when an average crystal-grain diameter at the plate surface is given as $D_s$ [μm], an average crystal-grain diameter at a depth of ¼$^{th}$ of the plate thickness is given as $D_q$ [μm], and an average crystal-grain diameter at a depth of ½ of the plate thickness is given as $D_c$ [μm], formula (1') to formula (5') below are satisfied, and the average crystal-grain diameter changes continuously in a plate-thickness direction:

$$D_s < 230 \quad (1'),$$

$$D_q \leq 280 \quad (2'),$$

$$D_c \leq 300 \quad (3'),$$

$$1.2 \leq D_q/D_s \quad (4'), \text{ and}$$

$$1.3 \leq D_c/D_s \quad (5').$$

10. The sputtering-target aluminum plate according to claim 9, wherein:
when an area ratio of the {001} plane at the plate surface is given as $B_{001s}$, an area ratio of the {001} plane at a depth of ¼$^{th}$ of the plate thickness is given as $B_{001q}$, and an area ratio of the {001} plane at a depth of ½ of the plate thickness is given as $B_{001c}$, formula (6') and formula (7') below are further satisfied:

$$1.5 \leq B_{001q}/B_{001s} \quad (6'), \text{ and}$$

$$2.0 \leq B_{001c}/B_{001s} \quad (7').$$

11. The sputtering-target aluminum plate according to claim 9, wherein:
when an area ratio of the {123} plane at the plate surface is given as $B_{123s}$, an area ratio of the {123} plane at a depth of ¼ of the plate thickness is given as $B_{123q}$, and an area ratio of the {123} plane at a depth of ½ of the plate thickness is given as $B_{123c}$, formula (8') and formula (9') below are further satisfied:

$$0 < B_{123q}/B_{123s} \leq 0.85 \quad (8'), \text{ and}$$

$$0 < B_{123c}/B_{123s} \leq 0.65 \quad (9').$$

12. The sputtering-target aluminum plate according to claim 10, wherein:
when an area ratio of the {011} plane at the plate surface is given as $B_{011s}$ and an area ratio of the {011} plane at a depth of ½ of the plate thickness is given as $B_{011c}$, formula (10') below is further satisfied:

$$0 < B_{011c}/B_{011s} \leq 0.9 \quad (10').$$

13. The sputtering-target aluminum plate according to claim 10, wherein:
when an area ratio of the {111} plane at the plate surface is given as $B_{111s}$ and an area ratio of the {111} plane at a depth of ½ of the plate thickness is given as $B_{111c}$, formula (11') below is further satisfied:

$$0 < B_{111c}/B_{111s} \leq 0.7 \quad (11').$$

14. The sputtering-target aluminum plate according to claim 10, wherein:
when an area ratio of the {112} plane at the plate surface is given as $B_{112s}$ and an area ratio of the {112} plane at a depth of ½ of the plate thickness is given as $B_{112c}$, formula (12') below is further satisfied:

$$0 < B_{112c}/B_{112s} \leq 0.9 \quad (12').$$

15. The sputtering-target aluminum plate according to claim 10, wherein:
when an area ratio of the {113} plane at the plate surface is given as $B_{113s}$ and an area ratio of the {113} plane at a depth of ½ of the plate thickness is given as $B_{113c}$, formula (13') below is further satisfied:

$$0 < B_{113c}/B_{113s} \leq 0.9 \quad (13').$$

16. A method of manufacturing the sputtering-target aluminum plate according to claim 9, comprising:
rolling an ingot composed of aluminum having a purity of 99.999 mass % or higher one time or a plurality of times, and
performing a final pass of the rolling under conditions that satisfy formula (14) and formula (15) below, wherein R [%] is the rolling reduction in the final pass of rolling and T [° C.] is the rolling-end temperature:

$$150 \leq T \leq 300 \quad (14), \text{ and}$$

$$R \leq 8.8 \times 10^{-4} \times (T+273)^2 - 0.9 \times (T+273) + 281 \quad (15).$$

17. The method of manufacturing the sputtering-target aluminum plate according to claim 16, wherein:
after the final pass of rolling has been performed, the aluminum plate is further heated at 200–350° C. and thereby annealed.

18. The sputtering-target aluminum plate according to claim 12, wherein:
- $B_{123s}$ is an area ratio of the {123} plane at the plate surface,
- $B_{123q}$ is an area ratio of the {123} plane at a depth of $1/4^{th}$ of the plate thickness,
- $B_{123c}$ is an area ratio of the {123} plane at a depth of $1/2$ of the plate thickness,
- $B_{111s}$ is an area ratio of the {111} plane at the plate surface,
- $B_{111c}$ is an area ratio of the {111} plane at a depth of $1/2$ of the plate thickness,
- $B_{112s}$ is an area ratio of the {112} plane at the plate surface,
- $B_{112c}$ is an area ratio of the {112} plane at a depth of $1/2$ of the plate thickness,
- $B_{113s}$ is an area ratio of the {113} plane at the plate surface,
- $B_{113c}$ is an area ratio of the {113} plane at a depth of $1/2$ of the plate thickness, and the following formula (8'), formula (9'), formula (11'), and formula (12') and formula (13') are further satisfied:

$$0 < B_{123q}c/B_{123s} \leq 0.85 \quad (8'),$$

$$0 < B_{123c}c/B_{123s} \leq 0.65 \quad (9'),$$

$$0 < B_{111c}c/B_{111s} \leq 0.7 \quad (11'),$$

$$0 < B_{112c}c/B_{112s} \leq 0.9 \quad (12'), \text{ and}$$

$$0 < B_{113c}c/B_{113s} \leq 0.9 \quad (13').$$

19. The sputtering-target aluminum plate according to claim 18, wherein the sputtering-target aluminum plate is formed by a process that comprises:
rolling an ingot composed of aluminum having a purity of 99.999 mass % or higher at least one time to form a plate having a thickness of 10-26 mm,
performing a final pass of the rolling of the plate under conditions that satisfy formula (14) and formula (30) below:

$$150 \leq T \leq 300 \quad (14), \text{ and}$$

$$R \leq 8.8 \times 10^{-4} \times (T+273)^2 - 0.9 \times (T+273) + 286 \quad (30), \text{ and}$$

after the final pass of rolling has been performed, annealing the plate at a temperature of 200-350° C.,
wherein:
R [%] is the amount of rolling reduction in the final pass of the rolling,
T [° C.] is the temperature of the plate at the end of the final pass of the rolling, and
the temperature of the plate at the start of the final pass of the rolling is 150° C. or higher and 500° C. or lower.

20. The sputtering-target aluminum plate according to claim 9, wherein the sputtering-target aluminum plate is formed by a process that comprises:
rolling an ingot composed of aluminum having a purity of 99.999 mass % or higher at least one time, and
performing a final pass of the rolling under conditions that satisfy formula (14) and formula (15) below:

$$150 \leq T \leq 300 \quad (14), \text{ and}$$

$$R \leq 8.8 \times 10^{-4} \times (T+273)^2 - 0.9 \times (T+273) + 281 \quad (15),$$

wherein:
R [%] is an amount of rolling reduction in the final pass of rolling, and
T [° C.] is the temperature of the sputtering-target aluminum plate at the end of the rolling.

* * * * *